United States Patent
Kim et al.

(10) Patent No.: US 8,324,067 B2
(45) Date of Patent: Dec. 4, 2012

(54) METHOD OF FORMING MEMORY DEVICE

(75) Inventors: Jung-in Kim, Seoul (KR); Jae-Hee Oh, Seongnam-si (KR); Hyunho Kim, Suwon-is (KR); Ji-Hyun Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/714,685

(22) Filed: Mar. 1, 2010

(65) Prior Publication Data

US 2010/0227449 A1    Sep. 9, 2010

(30) Foreign Application Priority Data

Mar. 4, 2009   (KR) .................. 10-2009-0018486

(51) Int. Cl.
    *H01L 21/02*          (2006.01)
(52) U.S. Cl. ................. 438/382; 257/E21.004
(58) Field of Classification Search .......... None
    See application file for complete search history.

(56) References Cited

U.S. PATENT DOCUMENTS

| | | | |
|---|---|---|---|
| 2006/0211231 A1* | 9/2006 | Asano et al. | 438/593 |
| 2007/0155172 A1* | 7/2007 | Lai et al. | 438/666 |
| 2007/0284656 A1* | 12/2007 | Radigan et al. | 257/328 |
| 2009/0179310 A1* | 7/2009 | Dunton et al. | 257/656 |

FOREIGN PATENT DOCUMENTS

| | | |
|---|---|---|
| KR | 2004-38422 | 5/2004 |
| KR | 2006-7634 | 1/2006 |
| KR | 2007-28250 | 3/2007 |
| KR | 2008-2490 | 1/2008 |

* cited by examiner

*Primary Examiner* — Seahvosh Nikmanesh
(74) *Attorney, Agent, or Firm* — Stanzione & Kim, LLP (57) ABSTRACT

A variable resistance memory device, and a method of forming the same. The method may include forming a lower electrode on a substrate, stacking a first etch stop layer and a second etch stop layer on the substrate, forming an insulating layer on the second etch stop layer, forming a recessing region to expose the lower electrode by patterning the insulating layer and the first and second etch stop layer, forming a variable resistance material layer in the recess region, and forming an upper electrode on the variable resistance material layer. The first etch stop layer can have an etching selectivity with respect to the second etch stop layer.

7 Claims, 9 Drawing Sheets

METHOD OF FORMING MEMORY DEVICE

CROSS-REFERENCE TO RELATED APPLICATIONS

This U.S. non-provisional patent application claims priority under 35 U.S.C. §119 of Korean Patent Application No. 10-2009-0018486, filed on Mar. 4, 2009, the contents of which are hereby incorporated by reference in its entirety.

BACKGROUND

1. Field of the Invention

The present general inventive concept relates to a memory device, and more particularly, to a variable resistance memory device.

2. Description of the Related Art

A semiconductor memory device may be classified into a volatile memory device and a nonvolatile memory device. The volatile memory device, for example, DRAM (dynamic random access memory) and SRAM (static random access memory), loses its stored data when its power supply is interrupted. The nonvolatile memory device, for example, PROM (programmable ROM), EPROM (erasable PROM), EEPROM (electrically EPROM) and flash memory device, retains its stored data even when its power supply is interrupted.

Also, next generation semiconductor memory devices, for example, FRAM (ferroelectric random access memory), MRAM (magnetic random access memory) and PRAM (phase change random access memory), are being developed according to a trend of high performance and low electric power of a semiconductor memory device. Material constituting next generation semiconductor memory devices has a characteristic that its resistance becomes different depending on the applied current or voltage and its resistance is maintained even when its power supply is interrupted.

Among the variable resistance memory devices, the phase change random access memory (PRAM) using phase change material typically has the fastest operation speed and has a structure that is advantageous in high integration.

The phase change memory device stores data using phase change material. The phase change material has two stable states (that is, an amorphous state and a crystalline state) that are different from each other. Since a conversion of the two states may reversibly occur, the phase change material can be converted from an amorphous state into a crystalline state and after that, can be converted into the original amorphous state. On the other hand, after the phase change material is converted from a crystalline state into an amorphous state, the phase change material can be converted into the original crystalline state. Resistivity of the phase change material in an amorphous state is higher than resistivity of the phase change material in a crystalline state. Data can be stored in a phase change memory cell, and the stored data can be read by using a difference of resistivity in accordance with a state of the phase change material.

SUMMARY

Embodiments of the present general inventive concept provide a method of forming a memory device. The method may include forming a lower electrode on a substrate, stacking a first etch stop layer and a second etch stop layer on the substrate, forming an insulating layer on the second etch stop layer, forming a recessing region to expose the lower electrode by patterning the insulating layer and the first and second etch stop layer, forming a variable resistance material layer in the recess region, and forming an upper electrode on the variable resistance material layer. The first etch stop layer may have an etching selectivity with respect to the second etch stop layer.

Embodiments of the inventive concept also provide a method of forming a memory device. The method may include forming a first electrode on a substrate, forming an electrode protection layer on the first electrode, forming a damascene pattern including a recess region to expose a portion of the electrode protection layer on the electrode protection layer, and removing the electrode protection layer exposed through the recess region.

Additional embodiments of the present general inventive concept will be set forth in part in the description which follows and, in part, will be obvious from the description, or may be learned by practice of the general inventive concept.

Example embodiments of the present general inventive concept may be achieved by providing a memory device, including a substrate having a first electrode formed thereon, an electrode protection layer formed on the first electrode and having a recess region to expose a surface of the first electrode through the electrode protection layer, and a variable resistance material layer formed in the recess region to contact the first electrode.

The memory device may further include a second electrode formed on the variable resistance material layer opposite the first electrode, and the variable resistance material may be a phase change material.

The memory device may further include a word line disposed on the substrate to contact a first end of the variable resistance layer via the first electrode, and a bit line disposed on the substrate to contact a second end of the variable resistance layer opposite the first end via the second electrode.

The memory device may further include a select device connected between the word line and the first electrode to selectively change the resistance of the variable resistance layer.

The electrode protection layer may include a first etch layer and a second etch layer, and the recess region may include a first recess region to expose a portion of the first etch layer through the second etch layer, and a second recess region to expose a surface of the first electrode through the exposed portion of the first etch layer.

The memory device may further include an insulating layer disposed on the word line and having a contact hole to expose a portion of the word line, and the select device may be formed in the contact hole to connect the word line to the variable resistance layer via the first electrode.

Example embodiments of the present general inventive concept may also be achieved by providing a method of forming a memory device, including forming a first electrode on a substrate, forming an electrode protection layer on the first electrode, removing a portion of the electrode protection layer to expose a surface of the first electrode through the electrode protection layer, and depositing a variable resistance material layer in the removed portion of the electrode protection layer to contact the first electrode.

The method may further include forming a second electrode on the variable resistance material layer opposite the first electrode.

The method may further include forming a word line on the substrate to contact a first end of the variable resistance layer via the first electrode, and forming a bit line on the substrate to contact a second end of the variable resistance layer opposite the first end via the second electrode.

The method may further include forming an insulating layer on the word line and having a contact hole to expose a portion of the word line, and forming a select device in the contact hole to connect the word line to the variable resistance layer via the first electrode.

The forming an electrode protection layer may include forming a first etch layer and a second etch layer, and the removing a portion of the electrode protection layer may include forming a recess region on the second etch layer to expose a portion of the first etch layer through the second etch layer, and removing the exposed portion of the first etch layer to expose a surface of the first electrode through the electrode protection layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

The above and/or other embodiments of the present general inventive concept will become apparent and more readily appreciated from the following description of the exemplary embodiments, taken in conjunction with the accompanying drawings, in which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In the drawings, the thickness of layers and regions are exaggerated for clarity. It is noted that when an element such as a layer, region or substrate is referred to as being "on" or "onto" another element, it may lie directly on the other element or intervening elements or layers may also be present. It is also noted that, although the terms first, second, etc. may be used herein to describe various elements, these elements should not be limited by these terms. These terms are only used to distinguish one element from another.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It is further noted that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are schematic illustrations of example embodiments of the present invention. As such, variations from the shapes of the illustrations, as a result, for example, of manufacturing techniques and/or tolerances, are to be expected. Thus, example embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Figure 1:
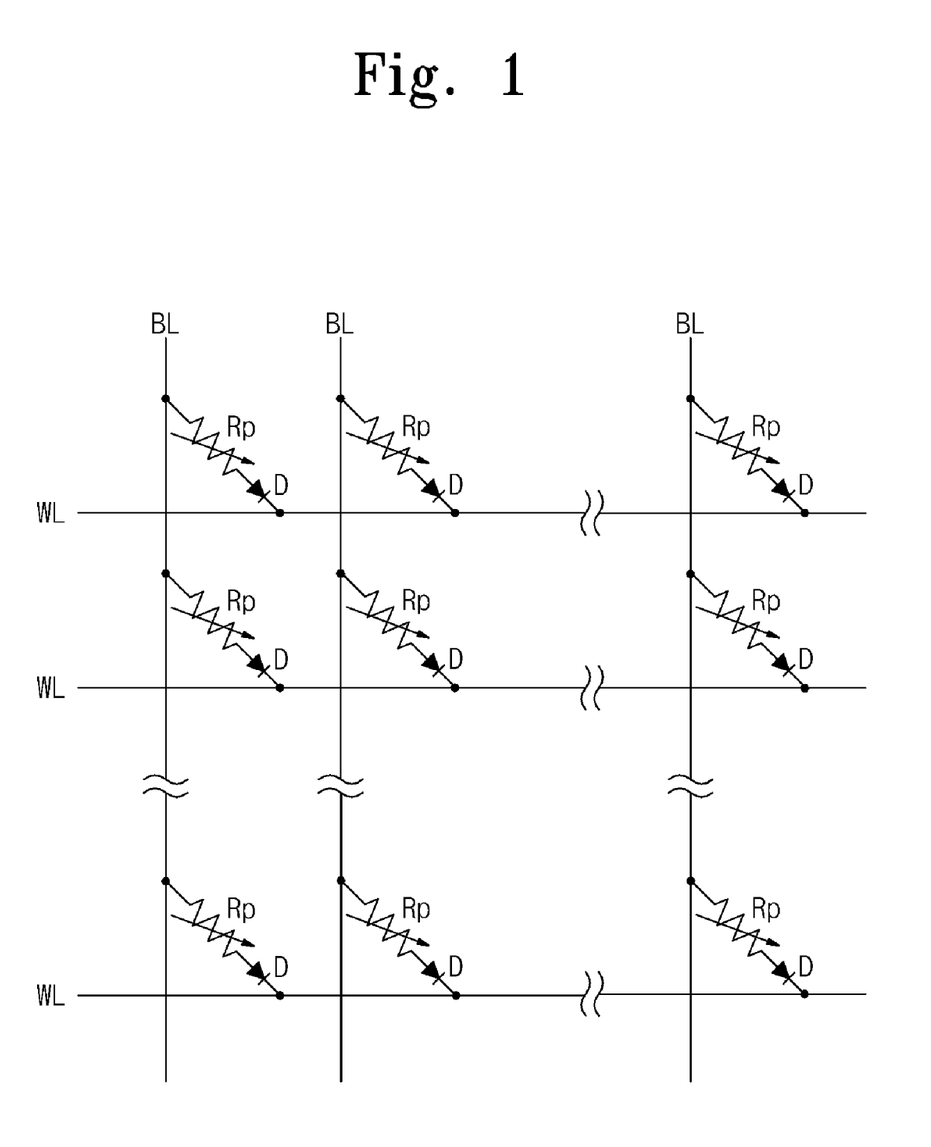
FIG. 1 is an equivalent circuit of a memory cell array in a variable resistance memory device in accordance with example embodiments of the inventive concept.
Figure 2:
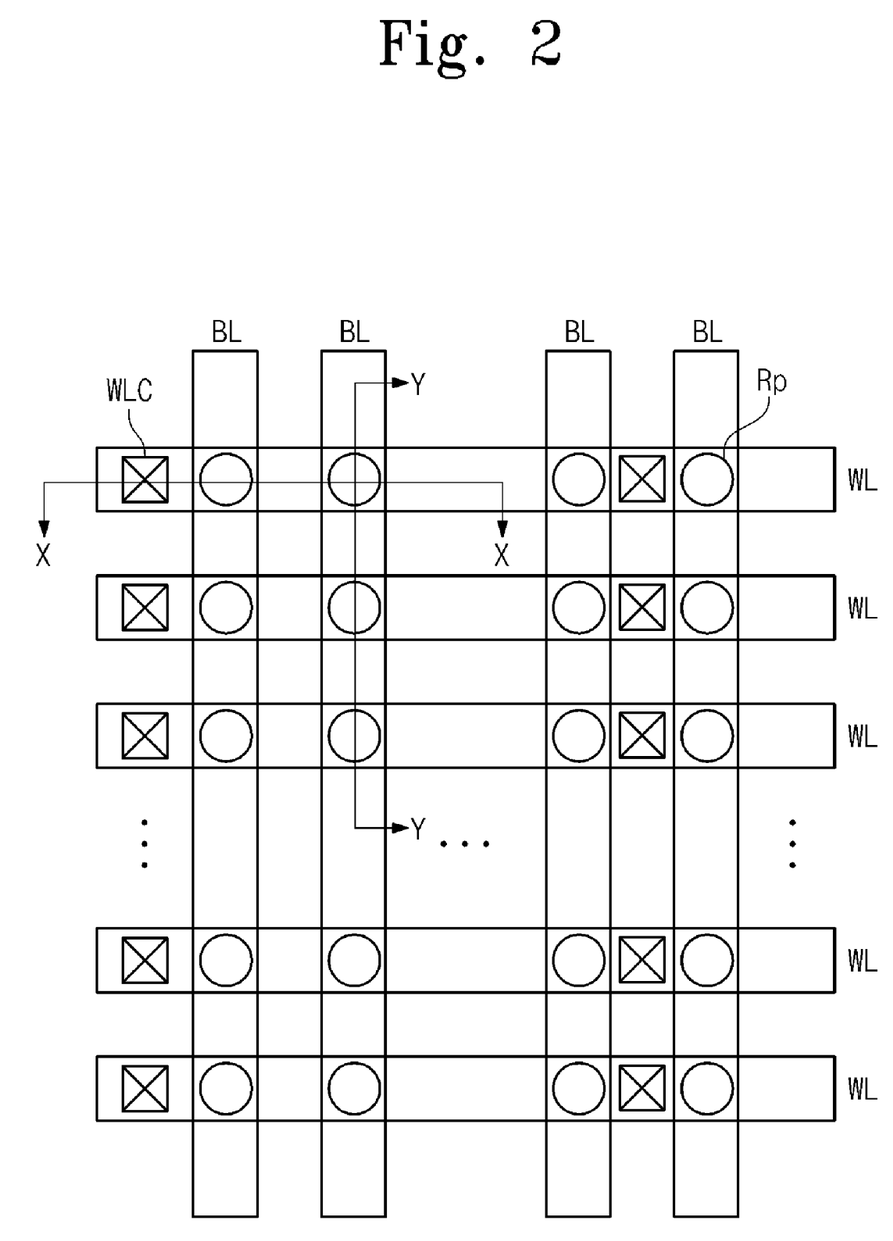
FIG. 2 is a top plan view illustrating a memory cell array corresponding to the equivalent circuit of FIG. 1.
Figure 3:
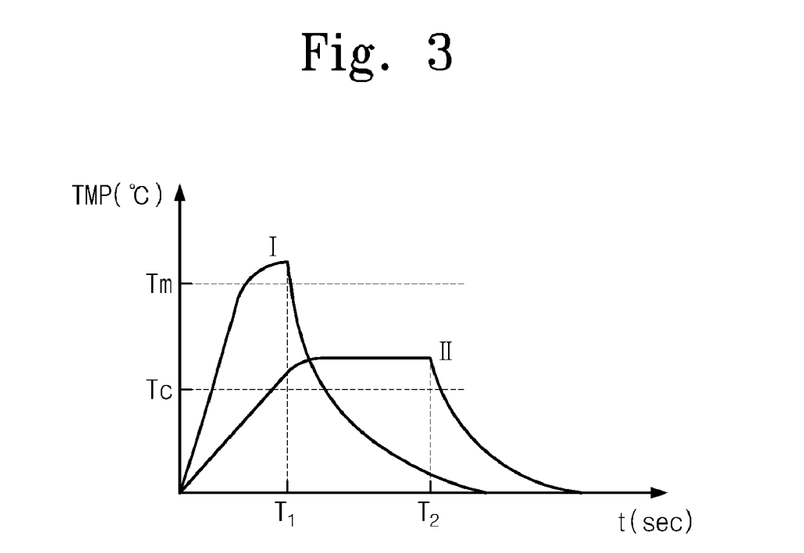
FIG. 3 is a graph illustrating phase change characteristics of a phase change material.

FIG. 1 is an equivalent circuit of a memory cell array in a variable resistance memory device in accordance with example embodiments of the present general inventive concept. FIG. 2 is a top plan view illustrating a memory cell array corresponding to the equivalent circuit of FIG. 1. FIG. 3 is a graph illustrating phase change characteristics of a phase change material.

Referring to FIGS. 1 and 2, a memory device in accordance with an example embodiment of the present general inventive concept may include a bit line (BL), a word line (WL) crossing the bit line (BL) and a memory cell defined at a position where the bit line (BL) and the word line (WL) cross each other. The memory cell may include a variable resistor (Rp) as a memory element. The variable resistor (Rp) may include a phase change material layer such as GST of which a crystalline state can be reversibly changed by an electrical signal such as a voltage or a current, an optical signal or radiation. The word line (WL) can be electrically connected to a strapping word line (not illustrated) through a word line contact (WLC).

One end of the variable resistor (Rp) may be connected to the bit line (BL) and the other end of the variable resistor (Rp) may be connected to the word line (WL) through a select device such as a diode or a transistor. That is, a diode or a transistor may be used as a select device to select the variable resistor (Rp), although the select device is not limited to a diode or transistor. In the example embodiment of FIG. 1, a diode (D) has been adopted as the select device.

FIG. 3 is a graph illustrating a method of programming or erasing the variable resistor (Rp). When the variable resistor (Rp) includes phase change material, and if the phase change material layer is cooled after heating the phase change material layer for a predetermined time at a temperature higher than a melting temperature (Tm), the phase change material layer is changed to an amorphous state (I), as illustrated in FIG. 3. However, if the phase change material layer is cooled after heating the phase change material layer for a predetermined time at a temperature lower than a melting temperature (Tm) and higher than a crystallizing temperature (Tc), the phase change material layer is changed to a crystalline state (II). Here, resistivity of the phase change material layer having an amorphous state is higher than resistivity of the phase change material layer having a crystalline state. Thus, whether data stored in the phase change material layer is logic '1' or logic '0' can be discriminated by detecting a current flowing through the phase change material layer in a read mode.

FIGS. 4 through 12 are cross sectional views illustrating a method of forming a variable resistance memory device in accordance with example embodiments of the present general inventive concept.

Figure 4:
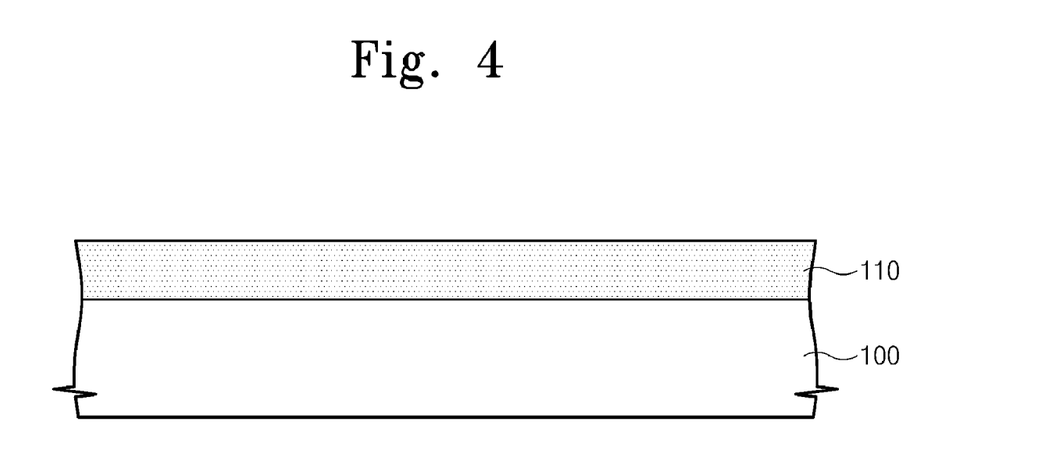
FIGS. 4 through 12 are cross sectional views illustrating a method of forming a variable resistance memory device in accordance with an example embodiment of the inventive concept.

Referring to FIG. 4, a word line 110 is provided onto a substrate 100. The substrate 100 may include an arbitrary semiconductor based structure having a silicon surface. The semiconductor based structure may include silicon, SOI (silicon on insulator) or a silicon epitaxial layer supported by a semiconductor structure. In an example embodiment of the present general inventive concept, the substrate 100 may be a p-type silicon substrate doped with a p-type impurity. The word line 110 may be formed on the substrate 100. The word line 110 may be formed by implanting an impurity ion into an active region of the substrate 100. For example, when the substrate 100 is a p-type silicon substrate, the word line 110 may be formed by implanting an n-type impurity. Alternatively, the word line 110 may be formed by other various methods without departing from the scope and spirit of the present general inventive concept. For example, the word line 110 may be formed by implanting an impurity ion after forming a plurality of parallel epitaxial semiconductor layers on the substrate 100 or by implanting an impurity ion together with a formation of an epitaxial semiconductor layer. In another embodiment of the inventive concept, the word line 110 may be formed of a metal thin layer.

Figure 5:
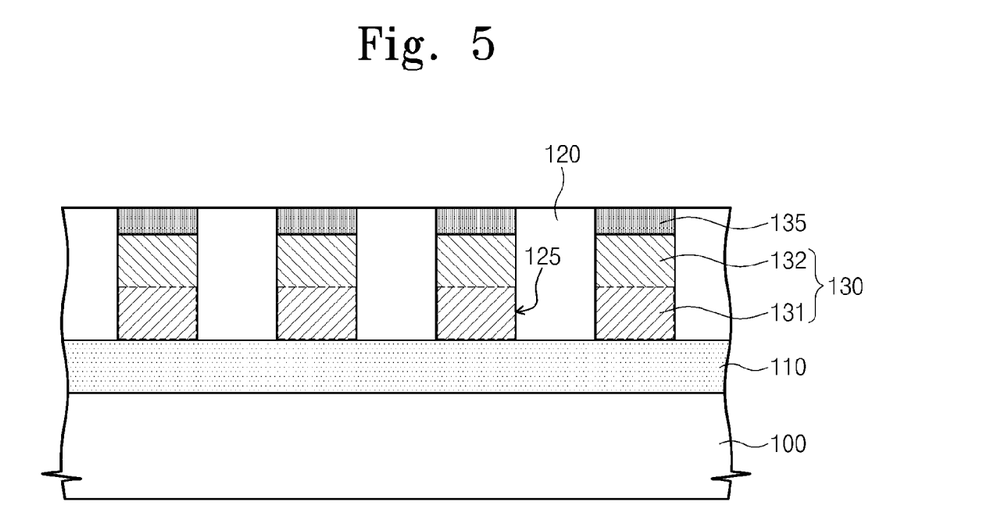

Referring to FIG. 5, an insulating material can be deposited on the word line 110 to form a first insulating layer 120, and the insulating layer 120 can be patterned to form a first contact hole 125 to expose the word line 110. A diode 130 may be formed in the first contact hole 125 to function as an exemplary select device for a particular memory cell. The diode 130 may be formed by depositing an n-type semiconductor layer 131 and a p-type semiconductor layer 132. According to an example embodiment of the present general inventive concept, the diode 130 may be formed by implanting an impurity after forming a semiconductor layer of germanium, silicon or silicon germanium, although the present general inventive concept is not limited thereto. The semiconductor layer in the first contact hole 125 may be formed by a selective epitaxial growth (SEG) or a solid phase epitaxial growth. The selective epitaxial growth (SEG) can grow an epitaxial layer using the word line 110 exposed by the first contact hole 125 as a seed layer. Alternatively, the solid phase epitaxial growth can crystallize a semiconductor layer after forming an amorphous or multi-crystalline semiconductor layer. According to an example embodiment of the inventive concept, the diode 130 is formed by the selective epitaxial growth (SEG) process, although the present general inventive concept is not limited thereto. As illustrated in FIG. 5, an ohmic layer 135 may be formed on the diode 130. The ohmic layer 135 can reduce a contact resistance between the diode 130 and a lower electrode as described in more detail below. Here, the ohmic layer 135 may be a silicide layer. For example, the ohmic layer 135 may be formed of metal silicide such as cobalt silicide, nickel silicide or titanium silicide.

Figure 6:
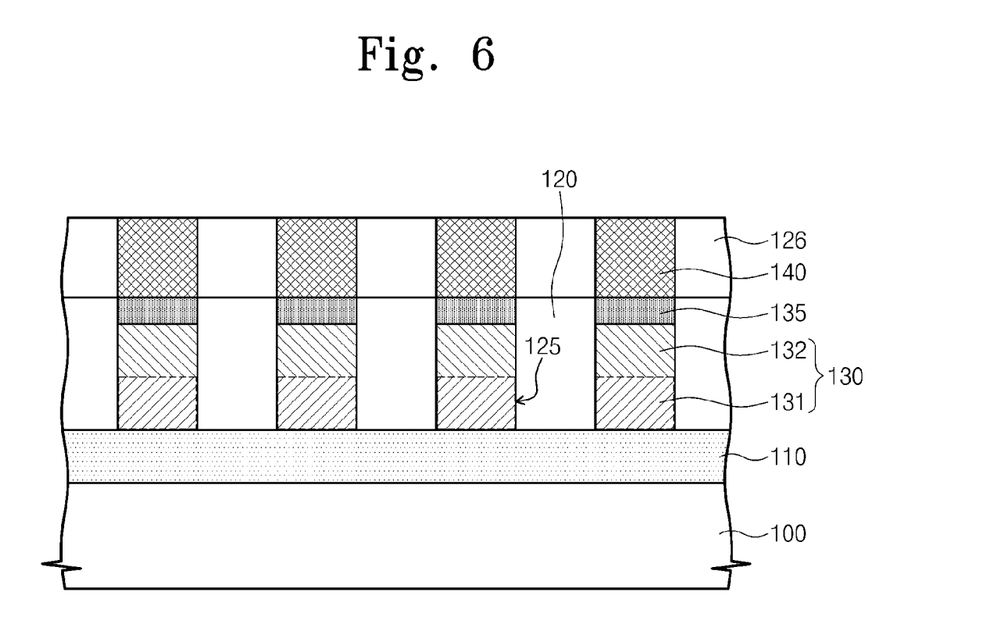

Referring to FIG. 6, a lower electrode 140 may be formed on the ohmic layer 135. The lower electrode 140 may be a metal material which does not react to a variable resistance material layer as described in more detail below. In an example embodiment of the present general inventive concept, the lower electrode 140 may be titanium nitride (TiN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON), tantalum oxynitride (TaON) or combinations thereof. According to an example embodiment of the present general inventive concept, after forming a second insulating layer 126 on the ohmic layer 135, the second insulating layer 126 can be patterned to form a recess region, and after forming a conductive layer on the recess region, the conductive layer can be planarized using a chemical mechanical polishing (CMP) to form the lower electrode 140. The lower electrode 140 may perform a function of changing a resistance of a variable resistance material layer. According to an example embodiment of the present general inventive concept, a shape of a transverse section of the lower electrode 140 may include a round shape, a ring shape or a square shape.

Figure 7:
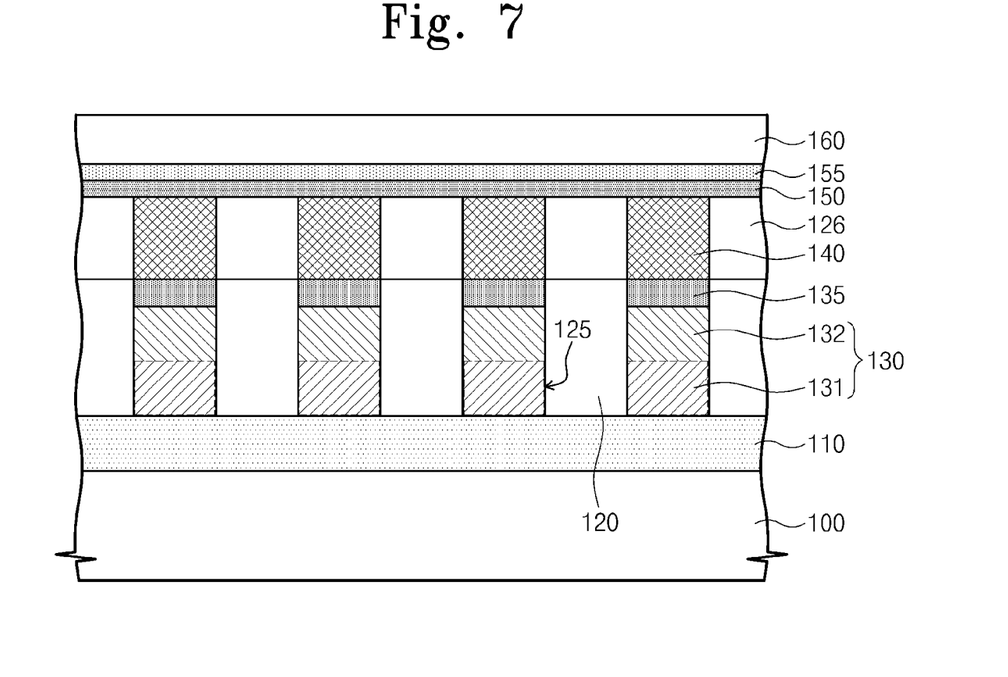

Referring to FIG. 7, an etch stop layer having multiple layers may be formed on the lower electrode 140. For example, as illustrated in FIG. 7, a first etch stop layer 150 may be formed on the lower electrode 140. The first etch stop layer 150 may be formed of a material having an etching selectivity with respect to a second etch stop layer 155 as described in more detail below. The first etch stop layer 150 may be an electrode protection layer. That is, during an exemplary recess process described below, the second etch stop layer 155 is recessed but the first etch stop layer 150 is not recessed or is less recessed than the second etch stop layer 155. Here, the first etch stop layer 150 may be metal oxide or carbide. The metal oxide can include oxidized hafnium, oxidized zirconium, oxidized tantalum and oxidized aluminum. The carbide may be an amorphous carbon layer (ACL). The first etch stop layer 150 may be formed by a chemical vapor deposition (CVD) or a physical vapor deposition (PVD). The second etch stop layer 155 may be formed on the first etch stop layer 150. According to an example embodiment of the present general inventive concept, the second etch stop layer 155 may be silicon nitride or silicon oxynitride. A third insulating layer 160 may be provided onto the second etch stop layer 155. The third insulating layer 160 may be oxide, nitride or oxynitride. The second etch stop layer 155 and the third insulating layer 160 may be formed by a CVD or a PVD process.

Figure 8:
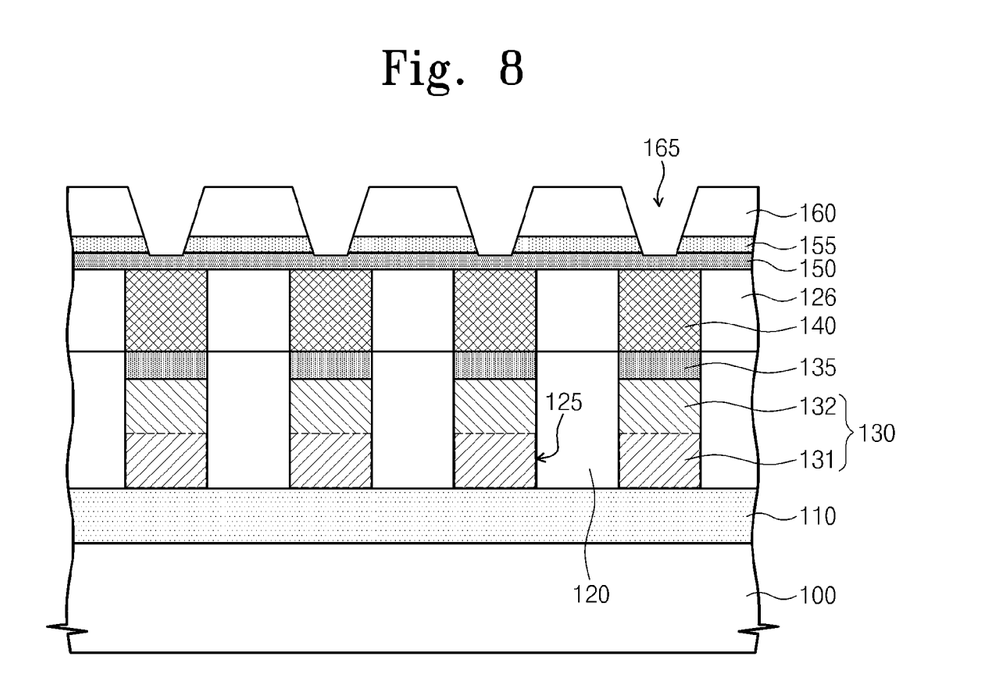

Referring to FIG. 8, the third insulating layer 160 and the second etch stop layer 155 can be patterned to form a first recess region 165. The patterning may be a portion of a damascene process, but the present general inventive concept is not limited thereto. Moreover, a shape of the first recess region 165 is not limited to the shape illustrated in FIG. 8, but many other shapes may also be used without departing from the scope and spirit of the present general inventive concept. For example, the patterning may be performed using a dry etching or a wet etching process. In an example embodiment of the present general inventive concept, when the patterning is performed, a portion of the first etch stop layer 150 may be recessed together with the third insulating layer 160 and the second etch stop layer 155. When an etching process is performed, the lower electrode 140 may be damaged by an activated ion due to plasma, an electron and an excited state molecule. For example, particles of the lower electrode 140 may be separated from a surface of the lower electrode 140 by a difference of an electric potential due to an etching process. In this case, a residue due to an etching process may exist on the lower electrode 140. As a result, an electrical characteristic may be deteriorated at an interface between the lower electrode 140 and a variable resistance material layer, and an operation characteristic of a memory device may be deteriorated. However, it is possible to prevent damage to the lower electrode 140 from the etching process by providing the first etch stop layer 150 on the lower electrode 140 as illustrated, for example, in FIG. 8.

Figure 9:
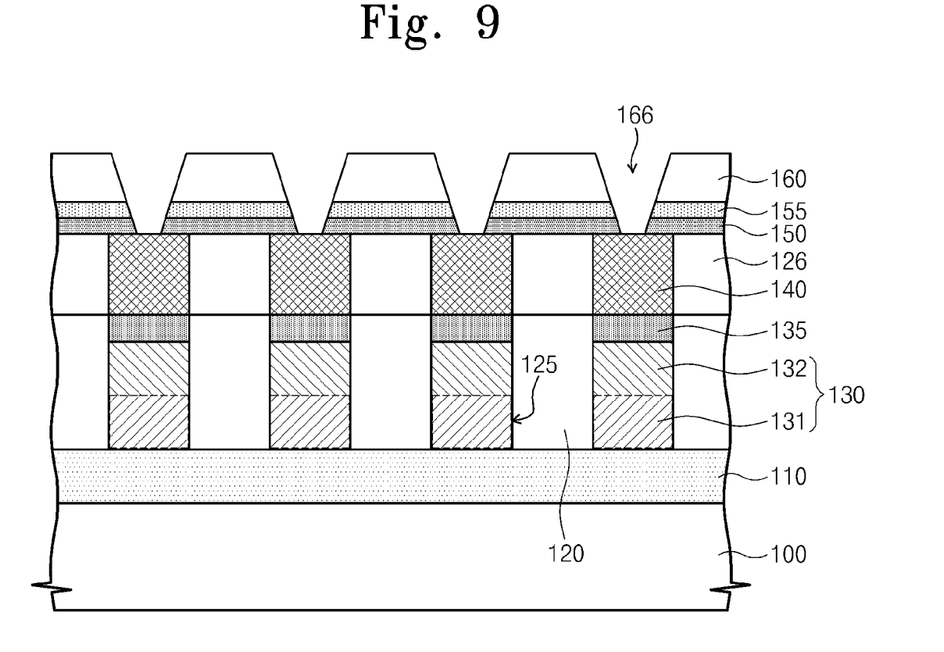

Referring to FIG. 9, the first etch stop layer 150 is removed over at least a portion of the lower electrode 140. As a result, the first recess region 165 may be enlarged to a second recess region 166. A removal of the first etch stop layer 150 over the lower electrode means a removal of residue of the first etch stop layer 150, thus exposing the lower electrode 140. The first etch stop layer 150 may be etched by a wet etching or a radio frequency (RF) etching, or sometimes both. According to an example embodiment of the present general inventive concept, the wet removal may be performed by an etchant including hydrogen fluoride (Hf), water ($H_2O$), hydrogen peroxide ($H_2O_2$) and the like. For example, the radio frequency (RF) etching method can be used to remove the first etch stop layer 150 by vibrating water or solvent using a radio frequency. Thus, the second recess region 166 can be formed to expose the lower electrode 140.

Figure 10:
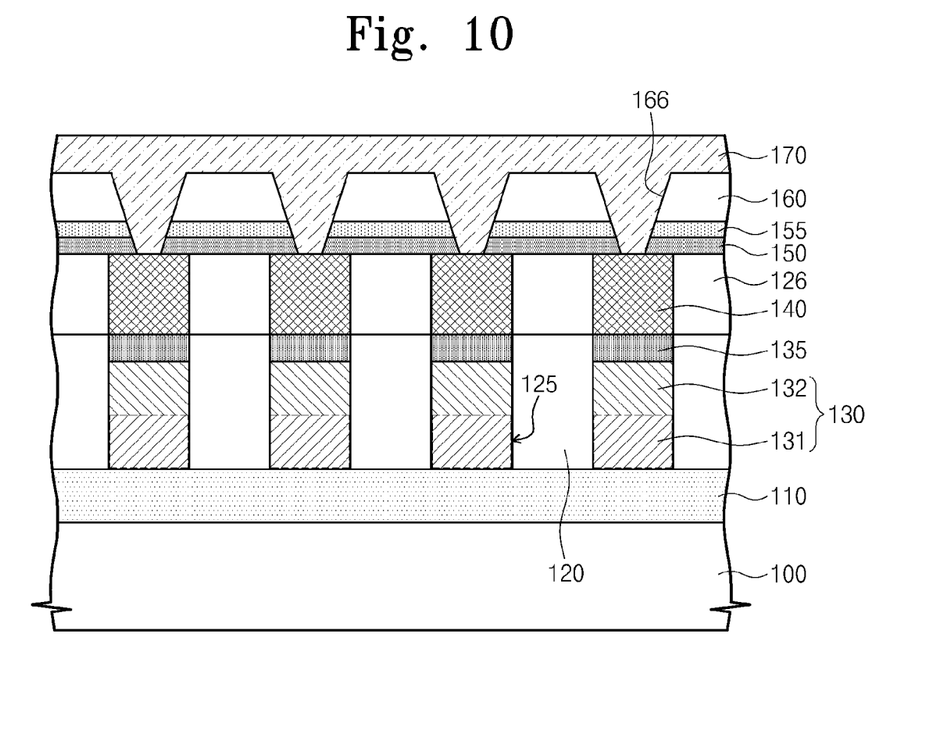

Referring to FIG. 10, a variable resistance material layer may be formed on the second recess region 166. The variable resistance material layer may be a phase change material layer 170. The phase change material layer 170 may be a material in which a state can be reversibly changed. For example, the phase change material layer 170 may be formed of material that a phase can be changed into an amorphous phase having high resistivity and a crystalline phase having low resistivity according to a heating temperature and a heat time. The material may include at least one selected from a group consisting of tellurium (Te), selenium (Se), germanium (Ge), antimony (Sb), bismuth (Bi), plumbum (Pb), tin (Sn), arsenic (As), sulfur (S), silicon (Si), phosphorus (P), oxygen (O) and compounds of thereof. For example, the phase change material layer 170 may be formed of chalcogen compound such as Ge—Sb—Te (GST), Ge—Bi—Te (GBT), As—Sb—Te, As—Ge—Sb—Te, Sn—Sb—Te, In—Sn—Sb—Te, Ag—In—Sb—Te, 5A group element of a periodic table-Sb—Te, 6A group element of a periodic table-Sb—Te, 5A group element of a periodic table-Sb—Se, 6A group element of a periodic table-Sb—Se or the aforementioned chalcogen compound doped with an impurity. An impurity doped in the aforementioned chalcogen compound may include nitrogen, oxygen, silicon or combinations thereof.

Figure 11:
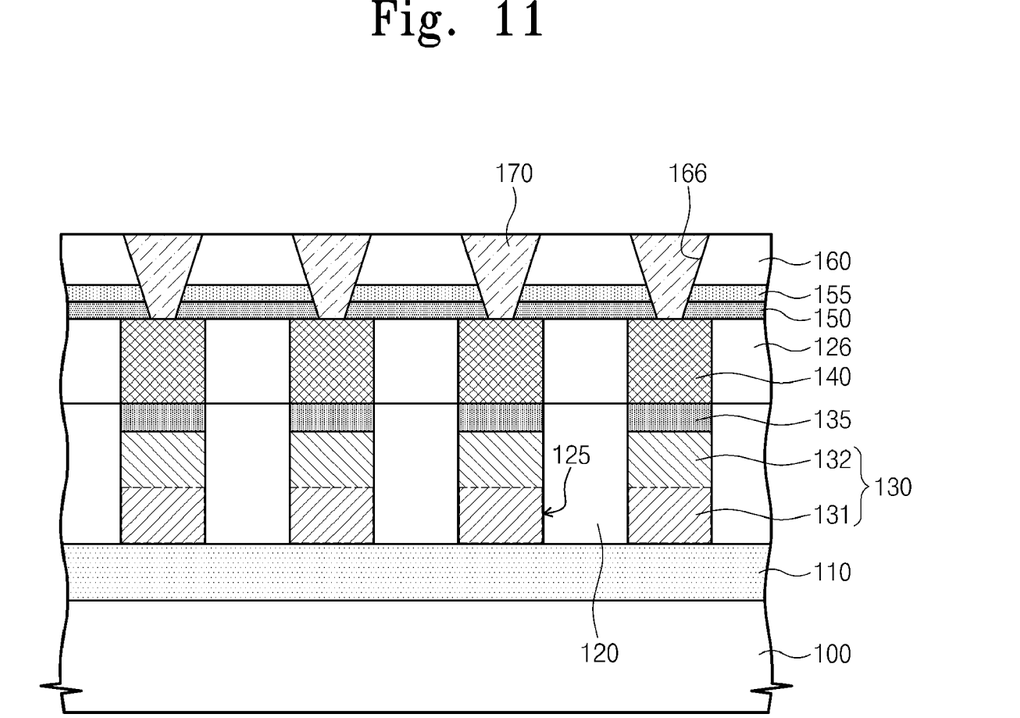

Referring to FIG. 11, the phase change material layer 170 may be planarized by a chemical mechanical polishing (CMP) process. The phase change material layer 170 may be divided into each cell by the palnarization.

Figure 12:
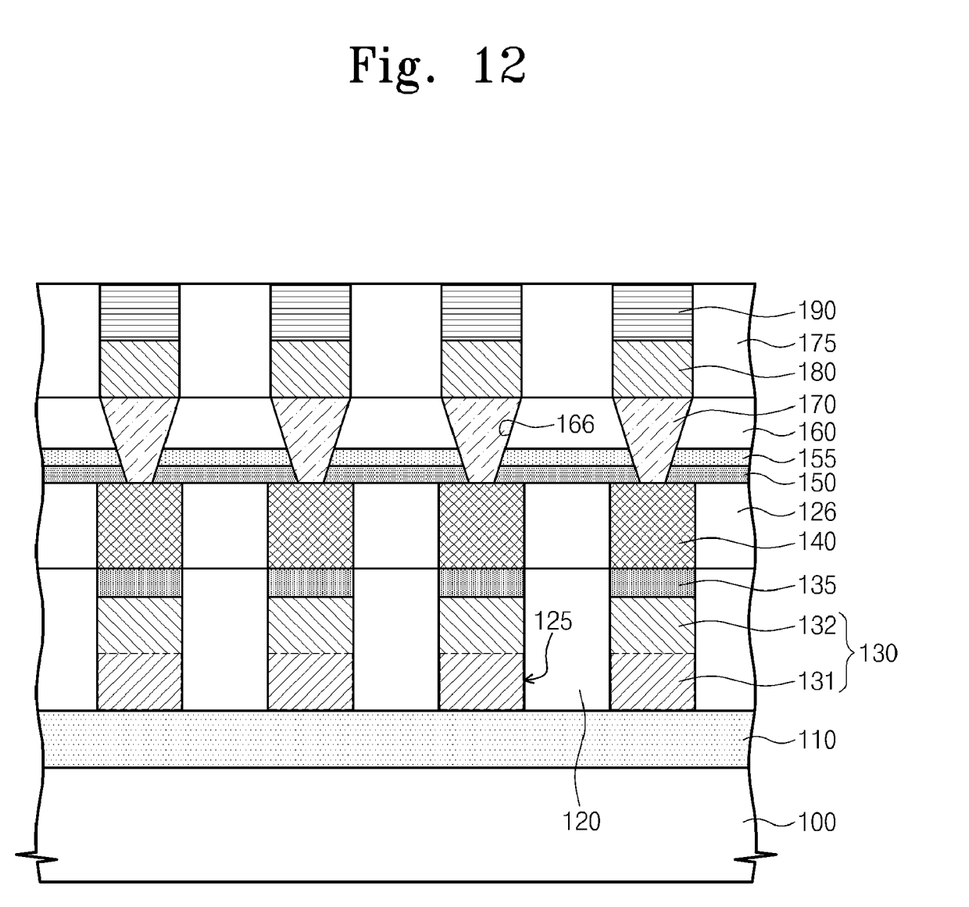

Referring to FIG. 12, an upper electrode 180 and a bit line 190 may be formed on the phase change material layer 170. According to an example embodiment of the present general inventive concept, after a fourth insulating layer 175 is formed on the phase change material layer 170, the fourth insulating layer 175 may be patterned to form a recess region. Here, a conductive layer may be formed on the recess region to sequentially form the upper electrode 180 and the bit line 190. The upper electrode 180 may be formed of the same material as the lower electrode 140, although the present general inventive concept is not limited thereto. The bit line may be formed of conductive material such as titanium (Ti), tungsten (W), silicon (Si), copper (Cu), tantalum (Ta), molybdenum (Mo), rubidium (Ru), aluminum (Al), gold (Au), platinum (Pt), silver (Ag) or an alloy including at least one of aforementioned elements. The bit line 190 may cross the word line 110. The memory device according to an example embodiment of the present general inventive concept can prevent deterioration of the lower electrode 140 by further providing the etch stop layer 150, thereby making it possible to improve operation characteristics of the memory device.

Figure 13:
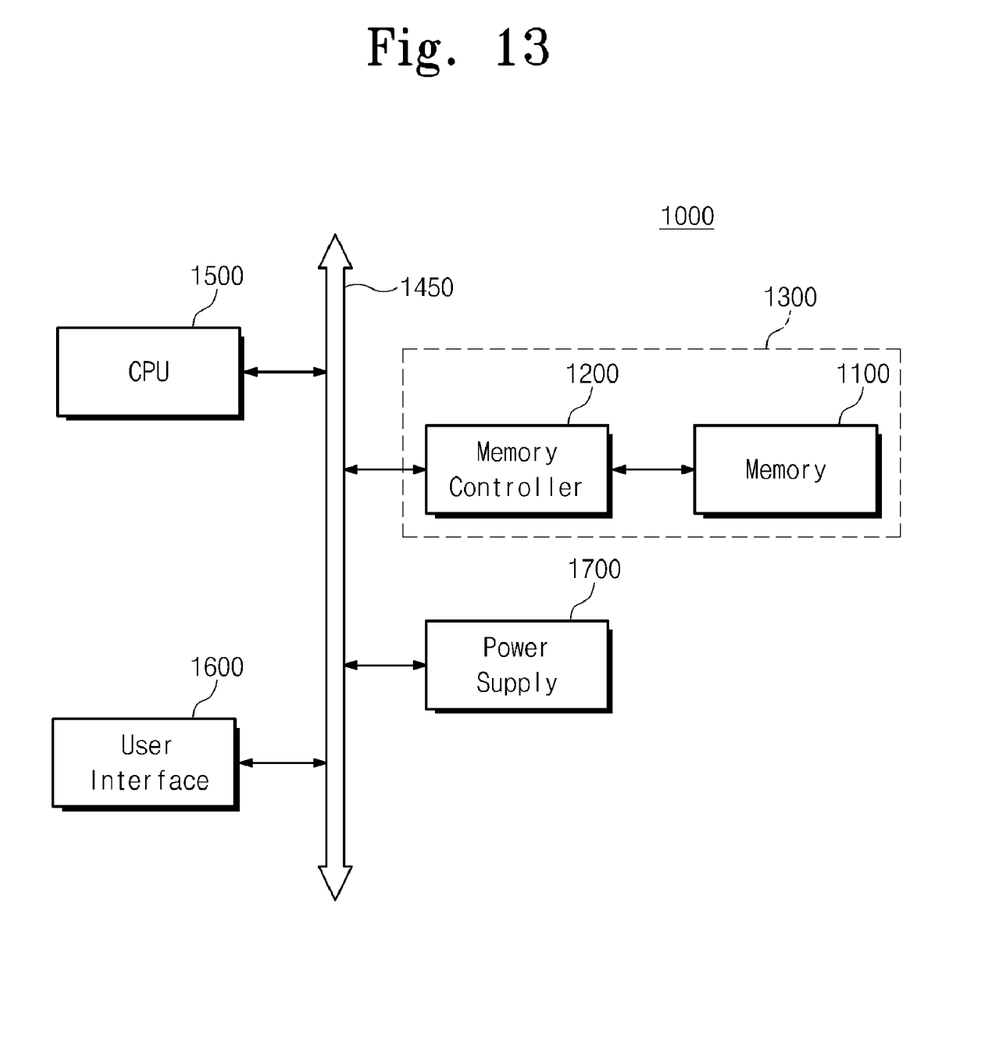
FIG. 13 is a block diagram of a memory system illustrating an example application of a variable resistance memory device in accordance with an embodiment of the inventive concept.

FIG. 13 is a block diagram of a memory system illustrating an example application of a variable resistance memory device in accordance with an embodiment of the present general inventive concept.

Referring to FIG. 13, a memory system 1000 according to an example embodiment of the present general inventive concept can include a semiconductor memory device 1300 comprised of a variable resistance memory device 1100 (e.g., PRAM) and a memory controller 1200, and a central processing unit 1500, a user interface 1600 and a power supply 1700 that are electrically connected to a system bus 1450.

As illustrated in FIG. 13, data provided by the user interface 1600 or processed by the central processing unit 1500 can be stored in the variable resistance memory device 1100 through the memory controller 1200. The variable resistance memory device 1100 may include a solid state disk (SSD) device, in which case a write speed of the memory system 1000 may greatly improved.

Although not illustrated in FIG. 13, the memory system 1000 may further include an application chipset, a camera image processor (CIS), a mobile DRAM or the like.

Also, the memory system 1000 may be applied to a PDA, a portable computer, a web tablet, a wireless phone, a mobile phone, a digital music player, a memory card or other known or later developed devices that can transmit and/or receive data in a wireless environment.

The variable resistance memory device or the memory system in accordance with example embodiments of the present general inventive concept may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In other example embodiments of the present general inventive concept, prevention of damage of the electrode due to the recess is not limited to the lower electrode but can be applied to damage of an electrode and a phase change material layer in a formation of a pattern by a damascene process. That is, in a case that a conductive layer is formed in a recess region after forming an insulating layer and patterning the insulating layer, the prevention of damage can be applied to all cases in which deterioration of electrical characteristics of an interface is caused due to an etching process.

For example, damage of a lower electrode can be prevented by a formation of a multilayer etch stop layer, thereby preventing deterioration of an operation characteristic of a memory device.

Although a few embodiments of the present invention have been illustrated and described, it would be appreciated by those skilled in the art that changes may be made in these embodiments without departing from the principles and spirit of the general inventive concept, the scope of which is defined in the claims and their equivalents.

What is claimed is:

1. A method of forming a semiconductor device comprising:
   forming a first electrode on a substrate;
   forming an electrode protection layer on the first electrode;

forming a damascene pattern on the electrode protection layer including a recess region in the electrode protection layer to expose a portion of the electrode protection layer; and removing a portion of the electrode protection layer exposed through the recess region and maintaining other portions of the electrode protection layer on the first electrode.

2. The method of claim 1, wherein forming the damascene pattern comprises:

forming an etch stop layer having an etching selectivity with respect to the electrode protection layer on the electrode protection layer;

forming an insulating layer on the etch stop layer; and patterning the insulating layer and the etch stop layer to form the recess region.

3. The method of claim 1, further comprising:

forming a variable resistance material layer which is in contact with a lower electrode exposed by a removal of the electrode protection layer; and forming a second electrode on the variable resistance material layer.

4. A method of forming a memory device, comprising:

forming an insulating layer having at least one recess region;

forming a first electrode on a substrate in the at least one recess region;

forming an etch stop layer on the first electrode;

forming an electrode protection layer on the first electrode and on the insulating layer;

removing a portion of the etch stop layer to expose a surface of the electrode protection layer;

removing a portion of the electrode protection layer to expose the first electrode and maintaining other portions of the electrode protection layer on the insulating layer; and depositing a variable resistance material layer in the removed portion of the electrode protection layer to contact the first electrode.

5. The method of claim 4, further comprising:

forming a second electrode on the variable resistance material layer opposite the first electrode.

6. The method of claim 5, further comprising:

forming a word line on the substrate to contact a first end of the variable resistance layer via the first electrode; and forming a bit line on the substrate to contact a second end of the variable resistance layer opposite the first end via the second electrode.

7. The method of claim 6, further comprising:

forming an insulating layer on the word line and having a contact hole to expose a portion of the word line; and forming a select device in the contact hole to connect the word line to the variable resistance layer via the first electrode.

* * * * *